United States Patent
Taylor

(10) Patent No.: US 9,201,287 B1
(45) Date of Patent: Dec. 1, 2015

(54) PHOTONIC ANALOG-TO-DIGITAL CONVERTER

(71) Applicants: The University of Connecticut, Farmington, CT (US); Opel Solar, Inc., Storrs Mansfield, CT (US)

(72) Inventor: Geoff W. Taylor, Mansfield, CT (US)

(73) Assignees: Opel Solar, Inc., Storrs Mansfield, CT (US); The University of Connecticut, Farmington, CT (US)

( * ) Notice: Subject to any disclaimer, the term of this patent is extended or adjusted under 35 U.S.C. 154(b) by 0 days.

(21) Appl. No.: 14/698,087

(22) Filed: Apr. 28, 2015

(51) Int. Cl.
*H03M 1/00* (2006.01)
*G02F 7/00* (2006.01)
(Continued)

(52) U.S. Cl.
CPC ............... *G02F 7/00* (2013.01); *H03M 1/0626* (2013.01); *H03M 1/1245* (2013.01); *H03M 1/00* (2013.01); *H03M 1/12* (2013.01)

(58) Field of Classification Search
CPC .............. G02F 7/00; H03M 1/12; H03M 1/00
USPC .................................. 341/137, 155, 156, 120
See application file for complete search history.

(56) References Cited

U.S. PATENT DOCUMENTS

| | | | |
|---|---|---|---|
| 6,031,243 | A | 2/2000 | Taylor |
| 6,118,397 | A | 9/2000 | Heflinger |
| 6,420,985 | B1 * | 7/2002 | Toughlian et al. ............ 341/137 |

(Continued)

FOREIGN PATENT DOCUMENTS

| | | |
|---|---|---|
| WO | WO 02/071490 A1 | 9/2002 |
| WO | WO 2013/025964 A1 | 2/2013 |

OTHER PUBLICATIONS

"General IIR Optical Filter Design for WDM Applications Using All-Pass Filters", C.K. Madsen, Journal of Lightwave Technology, vol. 18, No. 6, Jun. 2000, pp. 860-868.

(Continued)

*Primary Examiner* — Joseph Lauture
(74) *Attorney, Agent, or Firm* — Gordon & Jacobson, P.C.

(57) ABSTRACT

A photonic analog-to-digital converter is provided that includes a tunable light source, an optical sampling clock source, an optical splitter and a plurality of optical signal processing channels. The tunable light source produces an optical signal at a variable wavelength corresponding to analog levels of an electrical input signal. The optical sampling clock source produces an optical sampling clock signal that defines a sequence of sampling periods. The optical splitter is operably coupled to the tunable light source. The optical splitter splits the optical signal produced by the tunable light source for supply to the plurality of optical signal processing channels. Each one of the optical signal processing channels includes a photonic filter and corresponding optoelectronic thyristor comparator that is operably coupled to the optical sampling clock source. The optoelectronic thyristor comparator operates as a discriminator that generates a digital electrical signal representing whether the optical signal produced by the tunable light source has a wavelength that lies within a predetermined wavelength quantization level during the sampling periods defined by the optical sampling clock source. The photonic analog-to-digital converter further includes circuitry that generates a digital word corresponding to the digital electrical signals generated by the optoelectronic thyristor comparators of the plurality of optical signal processing channels.

22 Claims, 9 Drawing Sheets

(51) Int. Cl.
*H03M 1/12* (2006.01)
*H03M 1/06* (2006.01)

(56) References Cited

U.S. PATENT DOCUMENTS

| | | | |
|---|---|---|---|
| 6,479,844 | B2 | 11/2002 | Taylor |
| 6,525,682 | B2 | 2/2003 | Yap et al. |
| 6,841,795 | B2 | 1/2005 | Taylor et al. |
| 6,849,866 | B2 | 2/2005 | Taylor |
| 6,853,014 | B2 | 2/2005 | Taylor et al. |
| 6,870,207 | B2 | 3/2005 | Taylor |
| 6,873,273 | B2 | 3/2005 | Taylor et al. |
| 6,954,473 | B2 | 10/2005 | Dehmubed et al. |
| 6,995,407 | B2 | 2/2006 | Taylor et al. |
| 7,332,752 | B2 | 2/2008 | Taylor et al. |
| 8,014,676 | B2 | 9/2011 | Chen et al. |
| 2006/0045522 | A1 | 3/2006 | Gill et al. |

OTHER PUBLICATIONS

"Hybrid Silicon Tunable Filter Based on a Mach-Zehnder Interferometer and Ring Resonantor", Hui-Wen Chen et al., 2009 International Topical Meeting on Microwave Photonics, Oct. 14-16,—Valencia.

"Importance of Intrinsic-Q in Microring-Based Optical Filters and Dispersion—Compensation Devices", Mani Hossein-Zadeh et al., IEEE Photonics Technology Letters, vol. 19, No. 14, Jul. 15, 2007, pp. 1045-1047.

Microring-Resonator-Based Add-Drop Filters in SiN: Fabrication and Anlysis, Tymon Barwicz et al., Optics Express, vol. 12, No. 7, Apr. 5, 2004, pp. 1437-1442.

Multistage High-Order Microring-Resonator Add-Drop Filters, Milos A. Popovic et al., Optics Letters, vol. 31, No. 17, Sep. 1, 2006, pp. 2571-2573.

"Very High-Order Microring Resonator Filters for WDM Applications", B.E. Little et al., IEEE Photonics Technology Letters, vol. 16, No. 10, Oct. 2004, pp. 2263-2265.

U.S. Appl. No. 08/949,504, filed Oct. 14, 1997, Geoff W. Taylor.
U.S. Appl. No. 60/376,238, filed Apr. 26, 2002, Geoff W. Taylor.
U.S. Appl. No. 09/710,217, filed Nov. 10, 2000, Geoff W. Taylor.
U.S. Appl. No. 13/921,311, filed Jun. 19, 2013, Geoff W. Taylor.
U.S. Appl. No. 14/222,841, filed Mar. 24, 2014, Geoff W. Taylor.
U.S. Appl. No. 14/578,756, filed Dec. 22, 2014, Geoff W. Taylor et al.

* cited by examiner

PHOTONIC ANALOG-TO-DIGITAL CONVERTER

BACKGROUND

1. Field

The present application relates to analog-to-digital conversion, and more specifically to analog-to-digital conversion utilizing photonic technology.

2. State of the Art

Accurate collection and processing of electromagnetic information is critical to a wide variety of applications. Present day RF and microwave sensor systems must cover many frequency bands, detect and identify a large range of signal powers, and analyze the signal information on an ever-decreasing time scale. Simultaneously achieving these attributes typically requires multiple hardware systems, stressing even the most accommodating platforms and requiring the elimination of functionality on some. The power of digital signal processing to deliver increased functionality and improved system performance has long been recognized.

The resulting preference for digital representation of signals as the format for receiver system outputs has elevated the importance of the analog-to-digital converter (ADC), which serves as the interface between the received analog signals and the digital domain. With this move to the digital domain, the ADC is and will continue to be a major bottleneck for many systems.

An ADC performs two basic functions: sampling and quantization of an incoming continuous-time signal. The quantization function is performed by rounding down to the nearest discrete level. These functions consist of the discretization of a signal in time and amplitude, respectively, as illustrated in FIGS. 1A, 1B and 1C. FIG. 1A shows a continuous-time, continuous-amplitude analog signal. FIG. 1B shows the sampling instants of the analog signal in conjunction with the analog signal itself. FIG. 1C shows the quantization levels of the analog signal in conjunction with the analog signal itself. The number of discrete amplitude levels for the ADC is most often written in terms of the number of bits required to express the levels in binary form. For example, an ADC with a resolution of 8 bits would have $2^8$ or 256 different amplitude levels to approximate the continuous signal. The quantization function is therefore completely specified by two system parameters, the number of bits and the full-scale voltage of the ADC.

Since most ADCs take periodic measurements of the signal amplitude, the timing resolution is commonly described in terms of a uniform sample rate. The sampling rate can be specified by the frequency of sampling instants, the temporal precision of sampling instants, and the duration of the sampling window.

Timing jitter of the clock that defines the sampling instants will lead to errors in the digital representation of the sampled signal. In general, this effect can be ignored if the timing jitter is small compared with the error that is introduced by quantization. If this condition is not met, the timing jitter of the sampling clock will degrade the effective resolution of the ADC, hence the need for high-precision clock sources.

Another error that can be caused by the sampling process is signal aliasing, which is a fundamental limitation on the ability of uniform sampling to accurately represent the original continuous-time signal. The sampling theorem states that a signal of finite bandwidth can be completely reconstructed by an interpolation formula from its uniformly sampled values, so long as the sample rate is at least twice the highest frequency component of the original signal. Another way of stating this theorem is to say that for a given sample rate $f_s$, unambiguous identification of the input signal frequency is only possible for frequencies at less than half the sample rate $f_s/2$, known as the Nyquist frequency. After interpolation, sampled signals of higher frequency will erroneously appear to have a frequency between 0 and $f_s/2$. Therefore, there is a tradeoff between Nyquist frequency and resolution that must be balanced for uniformly clocked ADCs. Specifically, sampling higher-frequency signals makes the timing jitter requirements increasingly difficult to satisfy, resulting in a reduced effective number of bits.

SUMMARY

The aim of photonic circuits described herein is to leverage the unique benefits of photonic technology to build photonic ADC systems capable of improved speed, bandwidth, and accuracy.

The present disclosure is directed to a photonic analog-to-digital converter that includes a tunable light source, an optical sampling clock source, an optical splitter and a plurality of optical signal processing channels. The tunable light source produces an optical signal at a variable wavelength corresponding to analog levels of an electrical input signal. The optical sampling clock source produces an optical sampling clock signal that defines a sequence of sampling periods. The optical splitter is operably coupled to the tunable light source. The optical splitter splits the optical signal produced by the tunable light source for supply to the plurality of optical signal processing channels. Each one of the optical signal processing channels includes a photonic filter and corresponding optoelectronic thyristor comparator that is operably coupled to the optical sampling clock source. The optoelectronic thyristor comparator operates as a discriminator that generates a digital electrical signal representing whether the optical signal produced by the tunable light source has a wavelength that lies within a predetermined wavelength quantization level during the sampling periods defined by the optical sampling clock source. The photonic analog-to-digital converter further includes circuitry that generates a digital word corresponding to the digital electrical signals generated by the optoelectronic thyristor comparators of the plurality of optical signal processing channels.

In one embodiment, the photonic filter of each respective optical signal processing channel can provide passband optical filtering with respect to a wavelength passband corresponding to a given wavelength quantization level used in forming the digital word.

In another embodiment, the optoelectronic thyristor comparator of each respective optical signal processing channel can include a vertical thyristor and supporting optoelectronic circuitry that is configured to provide optical thresholding of an optical filter response signal supplied thereto during sampling periods defined by the optical sampling clock. In the event that the intensity of the optical filter response signal exceeds a predetermined threshold during a given sampling period, the thyristor can be configured to generate a digital electrical signal having a High level. In the event that the intensity of the optical filter response signal does not exceed the predetermined threshold during a given sampling period, the thyristor can be configured to generate a digital electrical signal having a Low level. The predetermined threshold is configured to discriminate the quantization levels (in the wavelength domain) used to form the digital word during the given sampling period. For the time periods outside a given sample period, the thyristor can be configured to operate as a latch circuit that outputs the High or Low levels of the digital electrical signal produced in the most-recent sampling period.

The optoelectronic thyristor comparator of each optical signal processing channel carries out sampling downstream from photonic filter functions provided the photonic filter of the optical signal processing channel.

The optical sampling clock signal can define a sampling rate that is two times the bandwidth of the electrical signal input.

The optoelectronic thyristor comparator can employ a thyristor defined by a layer structure that includes a bottom n-type cathode region, an intermediate p-type region formed above the bottom n-type region, an intermediate n-type region formed above the intermediate p-type region, and a top p-type anode region formed above the intermediate n-type region, wherein the thyristor includes an anode terminal electrically coupled to the top p-type anode region, an n-type injector terminal electrically coupled to the intermediate n-type region, a p-type injector terminal electrically coupled to the intermediate p-type region, and a cathode terminal electrically coupled to the n-type cathode region.

The supporting optoelectronic circuitry of the optoelectronic thyristor comparator can include a first phototransistor configured to receive the optical filter response signal. The first phototransistor can have a source-drain current path that is electrically coupled to the n-type injector terminal of the thyristor. The source-drain current path of the first phototransistor can be activated in the event that the received optical filter response signal exceeds a predetermined threshold intensity. The first phototransistor can be an n-channel HFET phototransistor whose source-drain current path is electrically coupled between a negative voltage supply and the n-type injector terminal of the thyristor.

The supporting optoelectronic circuitry of the optoelectronic thyristor comparator can further include a second phototransistor configured to receive the optical sampling clock signal. The second phototransistor can have a source-drain current path that is electrically coupled to the n-type injector terminal of the thyristor. The source-drain current path of the second phototransistor can be activated in the event that the received optical sampling clock signal is ON and exceeds a predetermined threshold intensity. The second phototransistor can be an n-channel HFET phototransistor whose source-drain current path is electrically coupled to the n-type injector terminal of the thyristor. The source-drain current paths of the first and second phototransistors can be connected in series to provide for electron injection into the n-type injector terminal of the thyristor in the event that the received optical filter response signal exceeds a predetermined threshold intensity and the optical sampling clock signal is ON. Such electron injection can be configured to switch the thyristor into its ON state where current is conducted from the anode terminal to the cathode terminal of the thyristor.

The supporting optoelectronic circuitry of the optoelectronic thyristor comparator can further include a third phototransistor configured to receive the optical sampling clock signal. The third phototransistor can have a source-drain current path that is electrically coupled to the p-type injector terminal of the thyristor. The source-drain current path of the third phototransistor can be activated in the event that the received optical sampling clock signal is ON and exceeds a predetermined threshold intensity. The third phototransistor can be an n-channel HFET phototransistor whose source-drain current path is electrically coupled between a negative voltage supply and the p-type injector terminal of the thyristor. The source-drain current path of the third phototransistor can provide for drainage of holes from the p-type injector terminal of the thyristor in the event that the optical sampling clock signal is ON.

The intermediate n-type and p-type regions of the layer structure of the thyristor can include an n-type modulation doped QW structure and a p-type modulation doped QW structure, respectively. The supporting optoelectronic circuitry of the optoelectronic thyristor comparator can include at least one phototransistor that includes an n-type QW channel formed by the n-type modulation doped QW structure of the epitaxial layer structure. The layer structure comprises group III-V materials.

The photonic filter of each respective optical signal processing channel can comprise a Mach-Zehnder interferometer or a multiple-ring resonator filter.

DETAILED DESCRIPTION OF THE PREFERRED EMBODIMENTS

Figure 1A:
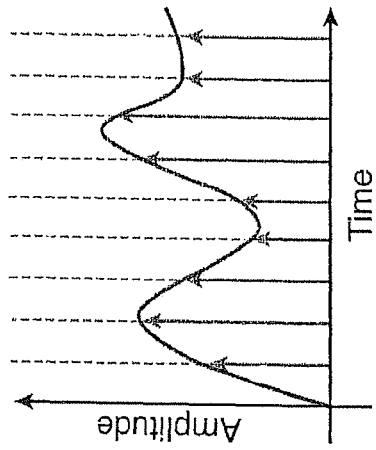
FIG. 1A shows a continuous-time, continuous-amplitude analog signal.
Figure 1B:
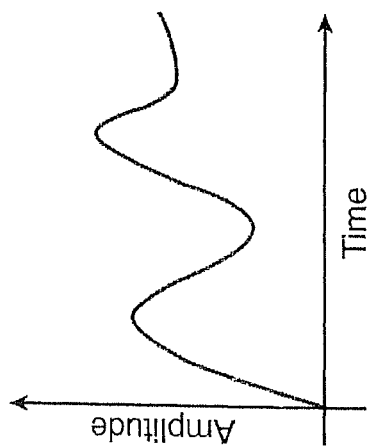
FIG. 1B shows the sampling instants of the analog signal of FIG. 1A in conjunction with the analog signal itself.
Figure 1C:
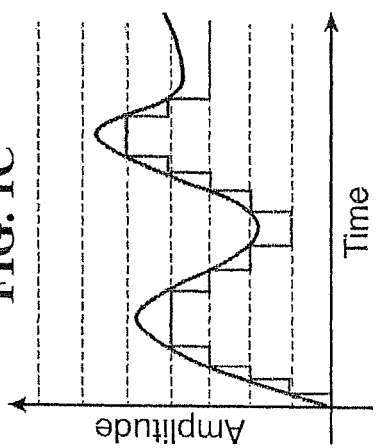
FIG. 1C shows the quantization levels of the analog signal of FIG. 1A in conjunction with the analog signal itself.
Figure 2:
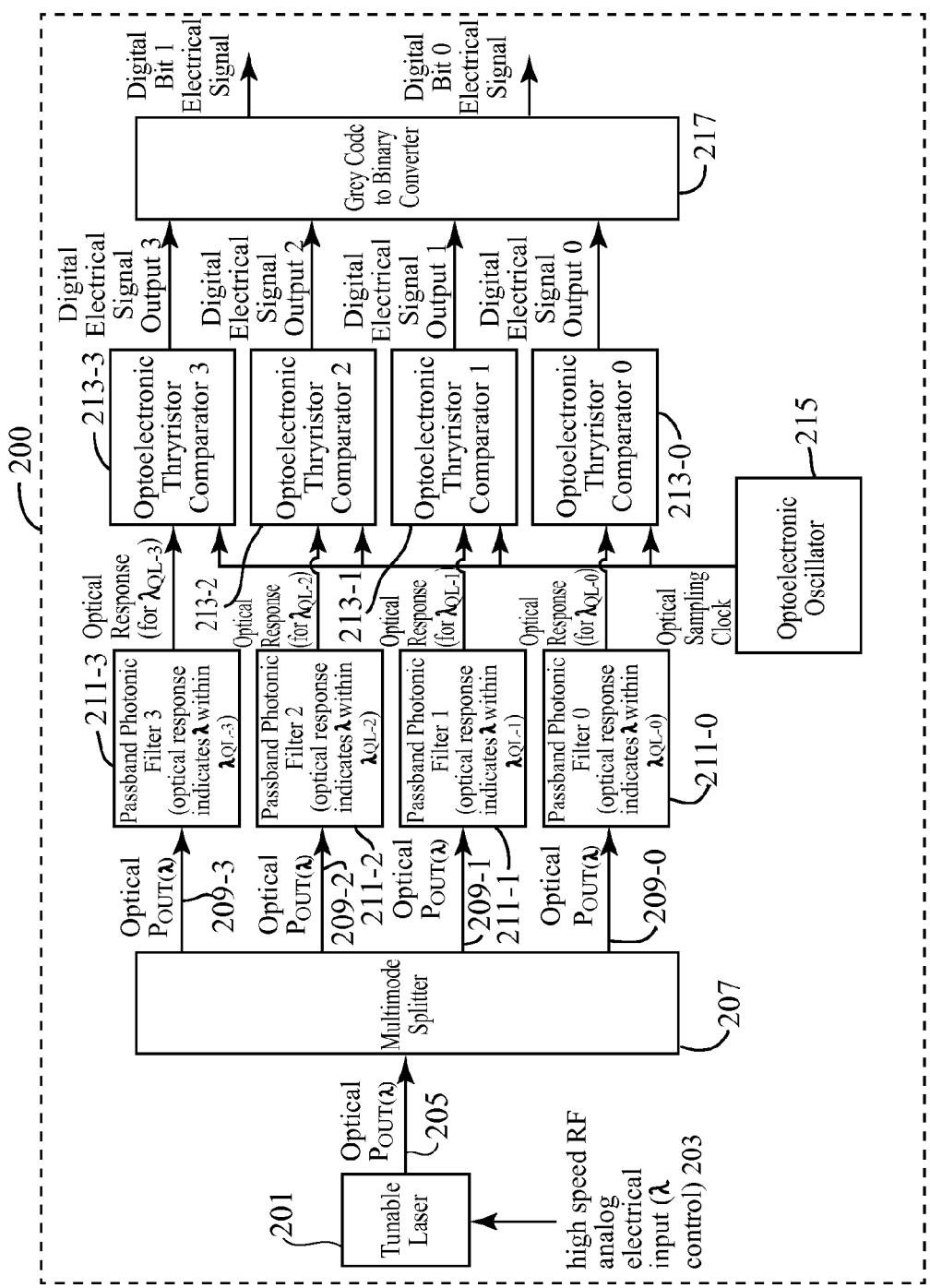
FIG. 2 is a functional block diagram of a photonic analog-to-digital converter according to the present disclosure.

FIG. 2 is a functional block diagram of a photonic analog-to-digital converter 200 according to the present disclosure. The photonic analog-to-digital converter 200 includes a tunable laser 201 that is supplied with a high speed RF analog electric input signal 203. The tunable laser 201 outputs a continuous output beam of light at a characteristic wavelength that changes according to amplitude (voltage level) of the high speed RF analog electric input signal 203. This output beam of light is labeled "Optical $P_{OUT}(\lambda)$ 205" in FIG. 2. The amplitude of the optical signal 205 can remain constant as its wavelength is varied over a range which corresponds to the amplitude of the RF analog input signal 203. The optical signal 205 generated by the tunable laser 201 is directed, for example by a waveguide or other suitable optical device, to a photonic analog-to-digital converter 200 as shown.

The photonic analog-to-digital converter 200 further includes a multimode optical splitter 207 that is configured to split the optical signal 205 into N optical signals that are directed, for example by waveguides or other suitable optical devices, for supply to N optical signal processing channels, which correspond to a number of wavelength quantization levels used in forming the digital word produced by the circuit 217 as described herein. For example, for a two-bit digital word $2^2$ or four wavelength quantization levels are used and the optical splitter 207 can be configured to split the output signal 205 from one to four optical signals ("Optical $P_{OUT}$ (λ)" with labels 209-0, 209-1, 209-2 and 209-3 as shown) which are provided to four optical signal processing channels as shown in FIG. 2. The optical splitter 207 is preferably an active multimode signal splitter, such as the optical splitter disclosed in U.S. Pat. No. 6,931,179, herein incorporated by reference in its entirety. The optical splitter 207, in addition to splitting the optical signal 205, can be configured to maintain the intensity of each optical signal along the respective light paths approximately the same, thus allowing the optical signal 205 to be split into a greater number of equal light paths without loss in light intensity.

Each one of the N optical signal processing channels includes a photonic filter 211 and a corresponding optoelectronic thyristor comparator 213 that function as a discriminator for detecting whether the wavelength of the optical signal 205 supplied thereto falls within one of the wavelength quantization levels used in forming the digital word during a sequence of sampling periods defined by an optical sampling clock signal. In this configuration, the optoelectronic thyristor comparators 213 of the N optical signal processing channels generate N digital electrical signals whose binary High/Low levels represent whether or not the wavelength of the optical signal 205 supplied to the N optical signal processing channels falls within the respective wavelength quantization levels during a sequence of sampling periods defined by an optical sampling clock signals.

The N digital electrical signals having High/Low levels as produced by the optoelectronic thyristor comparators 213 of the N optical signal processing channels are supplied to a grey code to binary converter circuit 217 that is configured to convert the binary High/Low levels of the N digital electrical signals into a corresponding digital word. For example, consider an embodiment that employs the four optoelectronic thyristor comparators 213-0, 213-1, 213-2 and 213-3 as shown in FIG. 2. In this embodiment, the grey code to binary converter circuit 217 can be configured to perform conversion operations according to the following table A.

TABLE A

| High/Low Level for Digital Electrical Signal Output 3 | High/Low Level for Digital Electrical Signal Output 2 | High/Low Level for Digital Electrical Signal Output 1 | High/Low Level for Digital Electrical Signal Output 0 | 2-bit Digital Word produced by circuit 217 |
|---|---|---|---|---|
| Low | Low | Low | High | 00 |
| Low | Low | High | Low | 01 |
| Low | High | Low | Low | 10 |
| High | Low | Low | Low | 11 |

The digital word produced by circuit 217 can possibly be processed to remove any noise spurs.

In this configuration, the optical signals Optical $P_{OUT}(\lambda)$ produced by the optical splitter 207 are each directed, for example by a waveguide or other suitable optical device, to a corresponding passband photonic filter 211. The wavelength passbands of the respective photonic filters 211 corresponds to the wavelength quantization levels in the final digital word. For example, for a two-bit digital word, $2^2$ or four wavelength quantization levels are used for the four passband photonic filters 211-0, 211-1, 211-2 and 211-3 as shown. The wavelength passband of the photonic filter 211-0, labeled as $\lambda_{QL\text{-}0}$, corresponds the lowest wavelength quantization level of the final digital word. The wavelength passband of the photonic filter 211-1, labeled as $\lambda_{QL\text{-}1}$, corresponds the next higher wavelength quantization level of the final digital word. The wavelength passband of the photonic filter 211-2, labeled as $\lambda_{QL\text{-}2}$, corresponds the next higher wavelength quantization level of the final digital word. And the wavelength passband of the photonic filter 211-3, labeled as $\lambda_{QL\text{-}3}$, corresponds the highest wavelength quantization level of the final digital word.

Figure 3:
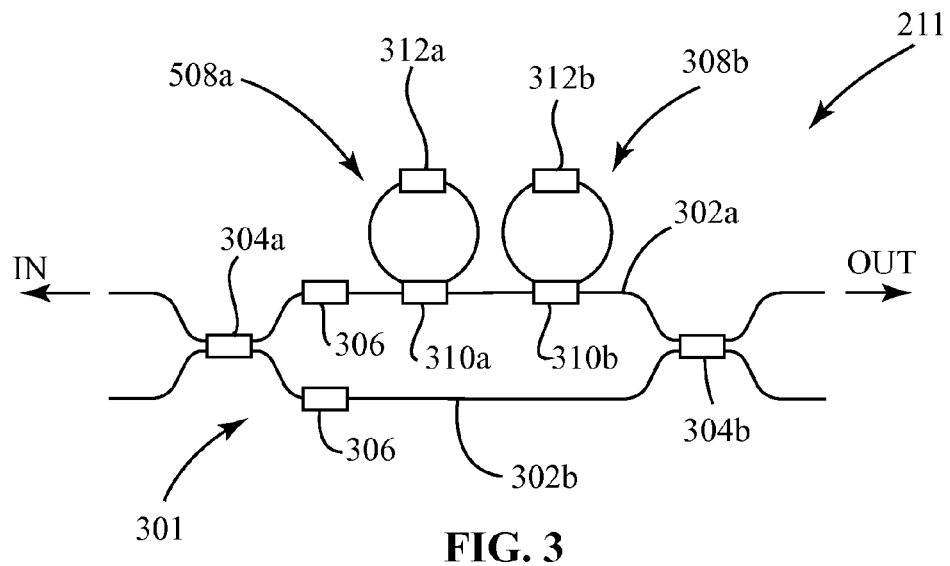
FIG. 3 is a schematic diagram of a passband photonic filter implemented by a Mach-Zehnder interferometer (MZI).

In one embodiment, the passband photonic filters 211 can be implemented by a Mach-Zehnder interferometer (MZI) 301 as shown in FIG. 3. Two internal arms 302a-b of MZI 301 are coupled between two optical couplers 304a, 304b. Optical coupler 304a is configured to divide the power of an input signal "IN", e.g., 209-0, 209-1, 209-2, or 209-3 of FIG. 2), substantially equally between the MZI arms 302a and 302b. Optical coupler 304b serves to mix the optical signals emerging from the MZI arms 302a and 302b to form the output signal "OUT." Both MZI arms 302a and 302b have a tunable phase shifter 306. MZI arm 302a is coupled to two optical resonators 308a and 308b via optical couplers 310a and 310b, respectively. The optical resonators 308a and 308b each incorporate a corresponding tunable phase shifter 312a and 213b, respectively.

The optical couplers 310a and 310b are both tunable and configured to control the optical coupling strength between the MZI arm 302a and the corresponding one of resonators 308a and 308b. In one embodiment, optical coupler 212 is an electrically-controlled optical coupler whose coupling strength depends on the carrier injection. Accordingly, the optical couplers 310a and 310b can be tuned electronically by injecting or removing charge from the respective optical couplers. In other embodiments, methods, such as thermal effect, stress, photo refractive effects, or other techniques can be used to control the change of the effective refractive index of waveguide material(s) of the couplers and thus the coupling strength of the couplers 310a and 310b.

A suitable electrically-controlled phase shifter that can be used to implement the tunable phase shifters 306, 312a and 312b is disclosed, e.g., in US. Patent Application Publication No. 2006/0045522, which is herein incorporated herein by reference in its entirety. The tunable phase shifters 306 serve to adjust the effective optical path length of the two MZI arms 302a and 302b. The tunable phase shifters 312a and 312b serve to adjust the effective optical path length of the corresponding resonators 308a and 308b.

The tunable phase shifters 306, 312a and 312b as well as the tunable optical couplers 310a and 310b for each respective photonic filter 211 can be controlled such that the respective photonic filter 211 passes optical signals whose wavelengths lie within the corresponding wavelength passband while filtering out (blocking) optical signals whose wavelengths lie outside the corresponding wavelength passband function. Note that the wavelength passbands of the respective photonic filter 211 correspond to the quantization levels (in the wavelength domain) for the binary values of the final digital word. For example, the tunable phase shifters 306, 312a and 312b as well as the tunable optical couplers 310a and 310b for photonic filter 211-0 can be configured to such that the photonic filter 211-0 passes optical signals whose wavelengths lie within the wavelength passband $\lambda_{QL\text{-}0}$ while filtering out (blocking) optical signals whose wavelengths lie outside the wavelength passband $\lambda_{QL\text{-}0}$. The tunable phase shifters 306, 312a and 312b as well as the tunable optical couplers 310a and 310b for photonic filter 211-1 can be configured to such that the photonic filter 211-1 passes optical signals whose wavelengths lie within the wavelength passband $\lambda_{QL\text{-}1}$ while filtering out (blocking) optical signals whose wavelengths lie outside the wavelength passband $\lambda_{QL\text{-}1}$. The tunable phase shifters 306, 312a and 312b as well as the tunable optical couplers 310a and 310b for photonic filter 211-2 can be configured to such that the photonic filter 211-2 passes optical signals whose wavelengths lie within the wavelength passband $\lambda_{QL\text{-}2}$ while filtering out (blocking) optical signals whose wavelengths lie outside the wavelength passband $\lambda_{QL\text{-}2}$. And the tunable phase shifters 306, 312a and 312b as well as the tunable optical couplers 310a and 310b for photonic filter 211-3 can be configured to such that the photonic filter 211-3 passes optical signals whose wavelengths lie within the wavelength passband $\lambda_{QL\text{-}3}$ while filtering out (blocking) optical signals whose wavelengths lie outside the wavelength passband $\lambda_{QL\text{-}3}$. Note that the wavelength passbands $\lambda_{QL\text{-}0}$, $\lambda_{QL\text{-}1}$, $\lambda_{QL\text{-}2}$, and $\lambda_{QL\text{-}3}$ corresponds the four quantization levels (in the wavelength domain) for the binary values of the 2-bit final digital word.

Figure 4:
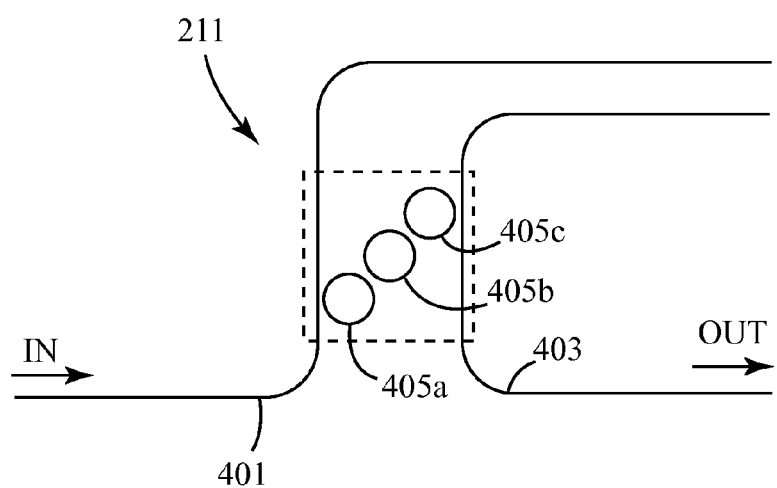
FIG. 4 is a schematic diagram of a passband photonic filter implemented by a multiple-ring resonator (MRR) filter.

In another embodiment, the passband photonic filters 211 can be implemented by multiple-ring resonator (MRR) filters arranged in a series configuration between an input waveguide 401 guiding the input optical signal "IN," e.g., 209-0, 209-1, 209-2, or 209-3 of FIG. 2, and an output waveguide 403 guiding the output optical signal "OUT." For example, FIG. 4 shows three MRR filters 405a, 405b and 405c. The resonance wavelengths of the MRR filters and coupling strength between such MRR filters of the respective photonic filter 211 can be controlled such that the respective photonic filter 211 passes optical signals whose wavelengths lie within the corresponding wavelength passband while filtering out (blocking) optical signals whose wavelengths lie outside the corresponding wavelength passband function. Note that the wavelength passbands of the respective photonic filters 211 correspond to the quantization levels (in the wavelength domain) for the binary values of the final digital word. For example, the resonance wavelengths of the MRR filters and coupling strength between such MRR filters of photonic filter 211-0 can be configured to such that the photonic filter 211-0 passes optical signals whose wavelengths lie within the wavelength passband $\lambda_{QL\text{-}0}$ while filtering out (blocking) optical signals whose wavelengths lie outside the wavelength passband $\lambda_{QL\text{-}0}$. The resonance wavelengths of the MRR filters and coupling strength between such MRR filters of photonic filter 211-1 can be configured to such that the photonic filter 211-1 passes optical signals whose wavelengths lie within the wavelength passband $\lambda_{QL\text{-}1}$ while filtering out (blocking) optical signals whose wavelengths lie outside the wavelength passband $\lambda_{QL\text{-}1}$. The resonance wavelengths of the MRR filters and coupling strength between such MRR filters of photonic filter 211-2 can be configured to such that the photonic filter 211-2 passes optical signals whose wavelengths lie within the wavelength passband $\lambda_{QL\text{-}2}$ while filtering out (blocking) optical signals whose wavelengths lie outside the wavelength passband $\lambda_{QL\text{-}2}$. And the resonance wavelengths of the MRR filters and coupling strength between such MRR filters of photonic filter 211-3 can be configured to such that the photonic filter 211-3 passes optical signals whose wavelengths lie within the wavelength passband $\lambda_{QL\text{-}3}$ while filtering out (blocking) optical signals whose wavelengths lie outside the wavelength passband $\lambda_{QL\text{-}3}$. Note that the wavelength passbands $\lambda_{QL\text{-}0}$, $\lambda_{QL\text{-}1}$, $\lambda_{QL\text{-}2}$, and $\lambda_{QL\text{-}3}$ corresponds the four quantization levels (in the wavelength domain) for the binary values of the 2-bit final digital word.

The N optical response signals produced by the array of photonic filters 211 are supplied to the corresponding ones of the N optoelectronic thyristor comparators 213 (such as the four optoelectronic thyristor comparators 213-0, 213-1, 213-2 and 213-3) of the optical signal processing channels as shown. An optical sampling clock signal generated by an optoelectronic oscillator 215 is split and supplied to each one of the N optoelectronic thyristor comparators 213. Preferably, the optical sampling clock signal produced by the optoelectronic oscillator 215 defines a sequence of sampling pulses having a fixed pulse duration. In this configuration, the ON state of the sampling pulses defines a sequence of sampling periods. The optoelectronic oscillator 215 can be configured to provide optical sampling pulses that are preferably equally spaced from one another and are of equal amplitude. The rate of the optical sampling clock signal is configured such it is at least two times the RF bandwidth of the analog electrical signal 203. In this configuration, only one of the N optical response signals produced by the array of photonic filters 211 will contain a significant amount of light passed from the Optical $P_{OUT}(\lambda)$ signals in order to activate the corresponding optoelectronic thyristor comparator during a given sampling period defined by the optical sampling clock, while the other optical response signals will contain much smaller amount of light (if any) passed from the Optical $P_{OUT}(\lambda)$ signals and thus not activate the corresponding optoelectronic thyristor comparators during the given sampling period defined by the optical sampling clock. The N optoelectronic thyristor comparators 213 each include a vertical thyristor (N region-P region-N region-P region semiconductor device) and supporting optoelectronic circuitry that is configured to provide optical thresholding of the optical response signal supplied thereto during sampling periods defined by the optical sampling clock. If the intensity of the optical response signal exceeds a predetermined threshold during a given sample period, the thyristor is configured to generate a digital electrical signal having a High level. However, if the intensity of the optical response signal does not exceed the predetermined threshold during a given sample period, the thyristor is configured to generate a digital electrical signal having a Low level. The predetermined thresholds for the optoelectronic thyristor comparators of the N optical signal processing channels are configured to levels of the optical response signals output by photonic filters 211 where such levels discriminate the quantization levels (in the wavelength domain) for the binary values of the final digital word. In this manner, the switching operations of the optoelectronic thyristor comparators 213 discriminate the optical response signals produced the array of photonic filters 211 during the sampling periods defined by the optical ON state of the optical sampling clock pulses that are generated by the optoelectronic oscillator 215 and supplied to the N optoelectronic thyristor comparators 213. For the time periods outside these sampling periods (which is defined by the optical OFF state of the optical sampling clock pulses that are generated by the optoelectronic oscillator 215 and supplied to the N optoelectronic thyristor comparators 213), the N optoelectronic thyristor comparators 213 are configured to operate as latch circuits that output the "High" or "Low" levels of the digital electrical signals produced by the optoelectronic thyristor comparators 213 in the most-recent sampling period. Note that the intensity of the N optical signals supplied to the optoelectronic thyristor comparators 213 need not be tightly constrained so long as the switching operations of the optoelectronic thyristor comparators corresponds to the quantization levels of the N optical signal processing channels. Also note that the optoelectronic thyristor comparators 213 of the optical signal processing channels carry out sampling downstream from the photonic filter functions provided by the photonic filters 211.

In one embodiment, the optoelectronic oscillator 215 can be realized by a vertical optical thyristor (N region-P region-N region-P region semiconductor device) with supporting circuitry as well as a feedback waveguide that is coupled to the waveguide region of the optical thyristor as described in U.S. patent application Ser. No. 14/578,756, filed on Dec. 22, 2014, commonly assigned to assignee of the present application and herein incorporated by reference in its entirety. The waveguide region of the optical thyristor acts as an optical pulse regenerator that emits an output optical pulse in response to a detected input optical pulse. An electrical output pulse corresponding the output optical pulse is generated at the cathode terminal of the optical thyristor. The feedback waveguide structure splits the output optical pulse into two parts. One part is output from the feedback waveguide structure to form a train of optical pulses that defines the output optical clock signal. The other part is guided by the feedback waveguide such that it returns back to the optical thyristor as an input optical pulse to produce another output optical pulse. Such optical pulse regeneration can be initiated by an electrical start-up pulse signal that is supplied to the n-channel injector of the optical thyristor. A semiconductor optical amplifier can be integral to the feedback waveguide and configured to amplify the optical pulse signal guided by the feedback waveguide. Such amplification can compensate for losses in splitting off the optical clock signal from the circuit. Alternatively, optoelectronic oscillator 215 can be realized by a mode-locked laser, fiber laser, semiconductor laser, or other devices known in the art that provide optical sampling pulses.

Figure 5:
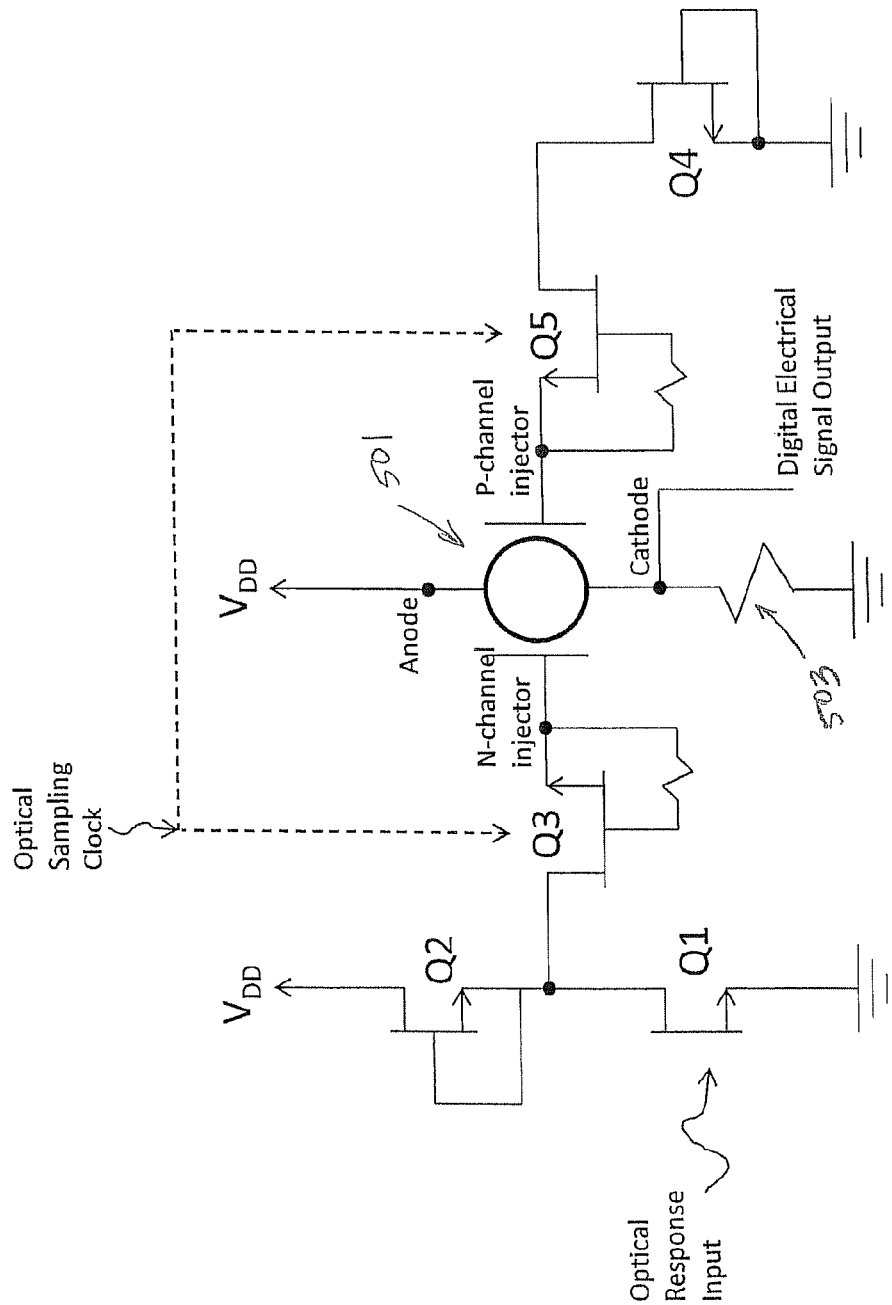
FIG. 5 is a schematic diagram of an embodiment of an optoelectronic thyristor comparator in accordance with the present invention.

An embodiment of an optoelectronic thyristor comparator 213 is shown in FIG. 5, which includes a four terminal vertical thyristor (N region-P region-N region-P region) 501 whose anode terminal is coupled to the positive voltage supply ($V_{DD}$). A load element 503 is coupled between the cathode terminal of the thyristor 501 and the negative voltage supply (ground). The thyristor 501 also has a p-channel injector terminal and an n-channel injector terminal as shown.

An n-channel HFET transistor Q2 and an n-channel HFET phototransistor Q1 are coupled in series between the positive voltage supply ($V_{DD}$) and the negative voltage supply (ground). The n-channel HFET transistor Q2 has source and gate terminals both connected to an intermediate node, which is the drain of the n-channel HFET phototransistor Q1. This intermediate node is connected to the n-channel injector terminal of the thyristor 501 via the source-drain current path of n-channel HFET phototransistor Q3. The n-channel HFET phototransistor Q3 has source and gate terminals both connected to the n-channel injector terminal of the thyristor 501.

An n-channel HFET transistor Q4 and an n-channel HFET phototransistor Q5 are coupled in series between the negative voltage supply (ground) and the p-channel injector terminal of the thyristor 501. The n-channel HFET transistor Q4 has source and gate terminals both connected to the negative voltage supply (ground). The drain terminal of the n-channel HFET transistor Q4 is connected to the p-channel injector terminal of the thyristor 501 via the source-drain current path of the n-channel HFET phototransistor Q5. The n-channel HFET phototransistor Q5 has source and gate terminals both connected to the p-channel injector terminal of the thyristor 501.

The optical response signal generated by the respective passband photonic filter is guided into the waveguide region of the n-channel HFET phototransistor Q1. The n-channel HFET phototransistor Q1 is configured such that its optical threshold level (which switches the source-drain current path of the n-channel phototransistor Q1 into its conducting ON state) discriminates the optical response signal output by the corresponding photonic filter 211. An optical sampling clock signal generated by an optoelectronic oscillator 215 is split and guided into the respective waveguide regions of the n-channel HFET phototransistors Q3 and Q5. The n-channel HFET phototransistors Q3 and Q5 are configured such their respective optical threshold levels (which switches the source-drain current paths of the n-channel phototransistors Q3 and Q5 into respective conducting ON states) are exceeded by the intensity of the ON state (sampling pulse) of the optical sampling clock signal.

In this configuration, the n-channel HFET phototransistors Q1, Q3 and Q5 cooperate as access transistors for the thyristor 501. The n-channel HFET phototransistor Q1 provides for injection of electron charge into the n-channel injector terminal of the thyristor 501 when i) the filter response signal supplied to the phototransistor Q1 exceeds the optical threshold level of the n-channel HFET phototransistor Q1 (and thus switches the source-drain current path of the n-channel phototransistor Q1 into its conducting ON state) and ii) the optical sampling pulse supplied to the phototransistor Q3 is ON (and thus switches the source-drain current path of the n-channel phototransistor Q3 into its conducting ON state). The n-channel HFET transistor Q2 provides for a drain of electron charge to the positive voltage supply ($V_{DD}$) when the optical sampling pulse supplied to the phototransistor Q3 is ON (irrespective of the switching state of the phototransistor Q1). The n-channel HFET transistor Q4 provides for a drain of hole charge from the p-channel injector terminal of the thyristor 501 to the negative voltage supply (ground) when the optical sampling pulse supplied to the n-channel HFET phototransistor Q5 is ON (and thus switches the source-drain current path of the n-channel phototransistor Q5 into its conducting ON state). The size of the n-channel HFET phototransistor Q1 is larger than the size of the n-channel HFET transistors Q2 and Q4 such that injection of electron charge into the n-channel injector terminal of the thyristor 501 via the n-channel HFET phototransistors Q1 and Q3 dominates the drain of electron charge to the positive voltage supply ($V_{DD}$) via n-channel HFET transistor Q2 when i) the filter response signal supplied to the n-channel HFET phototransistor Q1 exceeds the optical threshold level of the n-channel HFET phototransistor Q1 (and thus switches the source-drain current path of the n-channel phototransistor Q1 into its conducting ON state) and ii) the optical sampling pulse supplied to the phototransistor Q3 is ON (and thus switches the source-drain current path of the n-channel phototransistor Q3 into its conducting ON state). In this case, the dominant injection of electron into the n-channel injector terminal of the thyristor 501 via the phototransistors Q1 and Q3 also dominates the drain of hole charge to the negative voltage supply (ground) via n-channel HFET phototransistor Q5 and transistor Q4 when the optical sampling pulse supplied to the phototransistor Q5 is ON (and thus switches the source-drain current path of the n-channel phototransistor Q5 into its conducting ON state) such that thyristor 501 switches into its ON state where current is conducted vertically between the anode and the cathode terminals of the thyristor 501 and the Digital Electrical Signal Output generated at the cathode terminal has a "High" level. However, when the filter response signal supplied to the phototransistor Q1 does not exceed the optical threshold level of the n-channel HFET phototransistor Q1, the source-drain current path of the n-channel phototransistor Q1 is in its non-conducting OFF state (irrespective of the switching state of the n-channel HFET phototransistors Q3 and Q5 as controlled by the optical sampling clock) and the drain transistors Q2 and Q4 operate to drain charge from the n-channel and p-channel injectors of the thyristor 501 and operate the thyristor 501 in its OFF state where there is minimal conduction of current vertically between the anode and the cathode terminal of the thyristor 501 and the Digital Electrical Signal Output generated at the cathode terminal has a "Low" level. This operation allows the Digital Electrical Signal Output generated at the cathode terminal of the thyristor 501 to discriminate the optical filter response signal supplied to the n-channel HFET phototransistor Q1 during the ON state sampling period of the optical sampling clock supplied to the n-channel HFET phototransistors Q3 and Q5. For the time periods outside the ON state sampling periods of the optical sampling clock (which is defined by the optical OFF state of the optical sampling pulses that are generated by the optoelectronic oscillator 215), the source-drain current path of the re-channel phototransistors Q3 and Q5 are in their respective non-conducting OFF states and the thyristor 501 operates as a latch circuit that outputs the "High" or "Low" level of the Digital Electrical Signal output produced by the thyristor 501 in the most-recent sampling period.

The electronic circuit components (such as the HFET transistors and electrical thyristors) as well as the optoelectronic circuit components (such as the optical thyristors and HFET phototransistors) of the circuits as described herein can be implemented in one or more integrated circuits based on technology referred to by the Applicant as "Planar Optoelectronic Technology" or "POET". POET provides for the realization of a variety of devices (optoelectronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323, 390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; International Patent Application No. PCT/US12/51265, filed on Aug. 17, 2012; U.S. patent application Ser. No. 13/921,311, filed on Jun. 19, 2013; and U.S. patent application Ser. No. 14/222,841, filed on Mar. 24, 2014; all of which are hereby incorporated by reference in their entireties.

With these structures, a fabrication sequence can be used to make the devices on a common substrate. In other words, n type and p type contacts, critical etches, etc. can be used to realize all of these devices simultaneously on a common substrate. The essential features of this device structure include 1) an n-type modulation doped quantum well interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure. The active device structures can be realized with group III-V materials. Such group III-V materials can include gallium (Ga) and arsenic (As) (for gallium arsenide layer structures) as well as aluminum (Al) and indium (In), and thus can include GaAs, AlGaAs, and InGaAs semiconductor alloys. Alternatively, such group III-V materials can include gallium (Ga) and nitrogen (N) (for gallium nitride layer structures) as well as aluminum (Al) and indium (In), and thus can include GaN, AlGaN, and InGaN semiconductor alloys.

POET can be used to construct a variety of optoelectronic devices. POET can also be used to construct a variety of high performance transistor devices, such as complementary n-channel and p-channel HFET unipolar transistor devices as well as n-type and p-type HBT bipolar transistor devices.

Figure 6A:
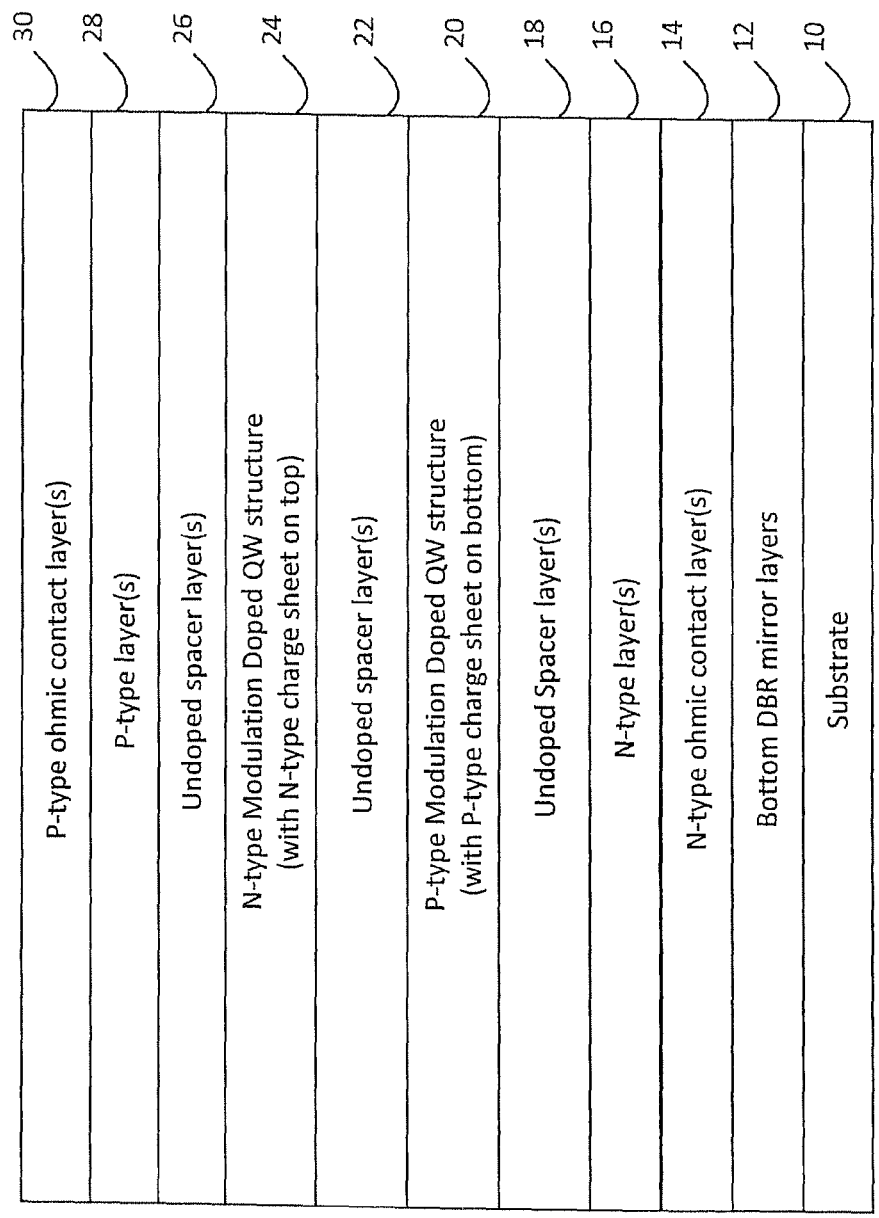
FIG. 6A is a schematic diagram of a layer structure for realizing optoelectronic circuits of the photonic analog-to-digital converter of FIG. 2 according to the present disclosure.

Turning now to FIG. 6A, the device structure of the present disclosure includes an optional bottom dielectric distributed Bragg reflector (DBR) mirror layers 12 formed on substrate 10. The bottom DBR mirror layers 12 can be formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4$) optical thickness, the reflections from each of the boundaries will be added in phase to produce a large amount of reflected light (e.g., a large reflection coefficient) at the particular center wavelength $\lambda_C$. Deposited upon the bottom DBR mirror layers 12 (or upon the substrate 10 for the case where the bottom DBR mirror layers 12 are omitted) is the active device structure suitable for realizing complementary heterostructure field-effect transistor (HFET) devices. The first of these complementary HFET devices is a p-channel HFET formed from a p-type modulation doped quantum well (QW) structure 20 with an n-type gate region (i.e., n-type ohmic contact layer(s) 14 and n-type layer(s) 16) below the p-type modulation doped QW structure 20. An undoped spacer layer 18 is disposed between the p-type modulation doped quantum well (QW) structure 20 and the underlying n-type layer(s) 16. One or more spacer layers 22 are disposed above the p-type modulation doped QW structure 20. The second of these complementary HFET devices is an n-channel HFET formed by an n-type modulation doped QW structure 24 with a p-type gate region (i.e., p-type layer(s) 28 and p-type ohmic contact layer(s) 30) disposed above the n-type modulation doped QW structure 24. An undoped spacer layer 26 is disposed between the n-type modulation doped QW structure 24 and the overlying p-type layer(s) 28. The spacer layer 22 forms the collector region of the p-channel HFET. Similarly, the spacer layer 22 forms the collector region of the n-channel HFET. Such collector regions are analogous to the substrate region of a MOSFET device as is well known. Therefore, a non-inverted n-channel HFET device can be stacked upon an inverted p-channel HFET device as part of the active device structure.

The active device layer structure begins with n-type ohmic contact layer(s) 14 which enables the formation of ohmic contacts thereto. Deposited on layer(s) 14 are one or more n-type layers 16 and an undoped spacer layer 18 which serve electrically as part of the gate of the p-channel HFET device and optically as a part of the lower waveguide cladding of the active device structure. Deposited on layer 18 is the p-type modulation doped QW structure 20 that defines a p-type charge sheet offset from one or more QWs (which may be formed from strained or unstrained heterojunction materials) by an undoped spacer layer. The p-type charge sheet is formed first below the undoped spacer and the one or more QWs of the p-type modulation doped QW structure 20. All of the layers grown thus far form the p-channel HFET device with the gate ohmic contact on the bottom. Deposited on the p-type modulation doped QW structure 20 is one or more spacer layers 22.

Deposited on the spacer layer(s) 22 is the n-type modulation doped QW structure 24. The n-type modulation doped QW structure 24 defines an n-type charge sheet offset from one or more QWs by an undoped spacer layer. The n-type charge sheet is formed last above the undoped spacer and the one or more QWs of the n-type modulation doped QW structure 24.

Deposited on the n-type modulation doped QW structure 24 is an undoped spacer layer 26 and one or more p-type layers 28 which can serve electrically as part of the gate of the n-channel HFET and optically as part of the upper waveguide cladding of the device. The p-type layers 28 can include two sheets of planar doping of highly doped p-material separated by a lightly doped layer of p-material. These p-type layers are offset from the n-type modulation doped quantum well structure 24 by the undoped spacer layer 26. In this configuration, the top charge sheet achieves low gate contact resistance and the bottom charge sheet defines the capacitance of the n-channel HFET with respect to the n-type modulation doped QW structure 24. Deposited on p-type layer(s) 28 is one or more p-type ohmic contact layer(s) 30, which enables the formation of ohmic contacts thereto.

For the n-channel HFET device, a gate terminal electrode of the n-channel HFET device interfaces to the p-type layers (e.g., p-type layer(s) 28 or top p-type ohmic contact layer(s) 30). A source terminal electrode and a drain terminal electrode of the re-channel HFET device are operably coupled to opposite sides of a QW channel region realized in the n-type modulation doped QW structure 24. The layer structure of the re-channel HFET device can be patterned and etched down to form one or more mesas at spacer layer 22 with a collector electrode formed on such mesa(s).

For the p-channel HFET device, a gate terminal electrode of the p-channel HFET device interfaces to the bottom n-type ohmic contact layer 14. A source terminal electrode and a drain terminal electrode are operably coupled to opposite sides of a QW channel region realized in the p-type modulation doped QW structure 20. The layer structure of the p-channel HFET device can be patterned and etched down to form a mesa at spacer layer 22 with a collector (or back-gate) electrode formed on such mesa.

It may be beneficial that the collector mesa(s) of the n-channel HFET devices and the back-gate mesa of the p-channel HFET devices be uniform in depth. Attempting to achieve this uniform depth by timed etching is difficult due to etch non-uniformity and thermal variations. A solution can be found by introducing an extremely thin layer (e.g. 10A) of AlAs during the epitaxial growth at the level of the collector mesa(s) of the n-channel HFET devices and the back-gate mesa of the p-channel HFET devices. This AlAs layer can act as an etch stop layer during etching in order to provide a uniform depth for the collector mesa(s) of the n-channel HFET devices and the back-gate mesa of the p-channel HFET devices formed on the substrate. In one embodiment, a dry etch can be performed to above and within 600A of the thin AlAs layer. Then a wet etch (preferably employing citric acid and $H_2O_2$ can be performed. This etch process stops naturally at the AlAs layer (i.e., the AlAs of 10A is extremely resistant to this etching process). Thus, a planar surface is established just at the back gate level which has the accuracy of the MBE growth.

Both the n-channel HFET device and the p-channel HFET device are field effect transistors where current flows as a two-dimensional gas through the QW channel region with contacts on either side of the channel region. The basic transistor action is the modulation of the QW channel conductance by a modulated electric field that is perpendicular to the QW channel. The modulated electric field modulates the QW channel conductance by controlling an inversion layer (i.e., a two-dimensional electron gas for the n-channel HFET device or a two-dimensional hole gas for the p-channel HFET) as a function of gate voltage relative to source voltage.

For the n-channel HFET device, the QW channel conductance is turned on by biasing the gate terminal electrode and the source terminal electrode at voltages where the P/N junction of the gate and source regions is forward biased with minimal gate conduction and an inversion layer of electron gas is created in the QW channel of the n-type modulation doped QW structure 24 between the source terminal electrode and the drain terminal electrode. In this configuration, the source terminal electrode is the terminal electrode from which the electron carriers enter the QW channel of the n-type modulation doped QW structure 24, the drain terminal electrode is the terminal electrode where the electron carriers leave the device, and the gate terminal electrode is the control terminal for the device.

The p-channel HFET device operates in a similar manner to the n-channel HFET device with the current direction and voltage polarities reversed with respect to those of the n-channel HFET device. For the p-channel HFET device, the QW channel conductance is turned on by biasing the gate terminal electrode and the source terminal electrode at a voltage where the P/N junction of the source and gate regions is forward-biased with minimal gate conduction and an inversion layer of hole gas is created in the QW channel of the p-type modulation doped QW structure 20 between the source terminal electrode and the drain terminal electrode. In this configuration, the source terminal electrode is the terminal from which the hole carriers enter the QW channel of the p-type modulation doped QW structure 20, the drain terminal electrode is the terminal where the hole carriers leave the device, and the gate terminal electrode is the control terminal for the device.

The active device structure of FIG. 6A can also be configured to realize bipolar inversion channel field-effect transistors (BICFETs) with either an n-type modulation doped QW inversion channel base region (n-channel base BICFET) or a p-type modulation doped QW inversion channel base region (p-channel base BICFET).

For the n-channel base BICFET device, an emitter terminal electrode of the re-channel base BICFET device interfaces to the top p-type ohmic contact layer(s) 30 of the active device structure. A base terminal electrode of the n-channel base BICFET device is operably coupled to the QW channel region realized in the n-type modulation doped QW structure 24. A collector terminal electrode of the n-channel base BICFET device is operably coupled to the p-type modulation doped QW structure 20. The n-channel base BICFET device is a bipolar junction type transistor which can be operated in an active mode by applying a forward bias to the PN junction of the emitter and base regions while applying a reverse bias to the PN junction of the base and collector regions, which causes holes to be injected from the emitter terminal electrode to the collector terminal electrode. Because the holes are positive carriers, their injection contributes to current flowing out of the collector terminal electrode as well as current flowing into the emitter terminal electrode. The bias conditions also cause electrons to be injected from the base to the emitter, which contributes to current flowing out of the base terminal electrode as well as the current flowing into the emitter terminal electrode.

The p-channel base BICFET device is similar in construction to the p-channel HFET device with the following adaptations. An emitter terminal electrode of the p-channel base BICFET device, which is analogous to the gate terminal electrode of the p-channel HFET device, interfaces to the bottom n-type ohmic contact layer(s) 14 of the active device structure. A base terminal electrode of the p-channel base BICFET device, which is analogous to the source or drain electrode of the p-channel HFET device, is operably coupled to the QW channel region realized in the p-type modulation doped QW structure 20. A collector terminal electrode of the p-channel base BICFET device, which is analogous to the collector terminal electrode of the p-channel HFET device, is operably coupled to the QW channel region realized in the n-type modulation doped QW structure 24. The p-channel base BICFET device is a bipolar junction type transistor which can be operated in an active mode by applying a forward bias to the PN junction of the emitter and base regions while applying a reverse bias to the PN junction of the base and collector regions, which causes electrons to be injected from the emitter terminal electrode to the collector terminal electrode. Because the electrons are negative carriers, their injection contributes to current flowing into the collector terminal electrode as well as current flowing out of the emitter terminal electrode. The bias conditions also cause holes to be injected from the base to the emitter, which contributes to current flowing into the base terminal electrode as well as the current flowing out of the emitter terminal electrode.

The active device structure of FIG. 6A can also be configured to realize a variety of electrical and optoelectronic thyristor devices having a vertical P-N-P-N thyristor structure. The upper p-type region (i.e., the first P) of the vertical P-N-P-N thyristor structure is formed by the p-type layers 28, 30 of the active device structure. The upper n-type region (i.e., the first N) of the vertical P-N-P-N thyristor structure is formed from the n-type modulation doped QW structure 24 of the active device structure. The lower p-type region (i.e., the second P) of the vertical P-N-P-N thyristor structure is formed from the p-type modulation doped QW structure 20 of the active device structure. The lower n-type region (i.e., the second N) of the vertical P-N-P-N thyristor structure is formed by the bottom n-type layers 14, 16 of the active device structure.

In one embodiment, the active device structure of FIG. 6A can be configured to realize all of the major optoelectronic and electronic circuit elements of the photonic analog-to-digital converter system as described herein on a single integrated circuit (or possibly multiple integrated circuits, if need be). In this manner, the tunable laser source, the multimode optical splitter, the photonic filters and optoelectronic thyristor comparators of the optical signal processing channels, the optoelectronic oscillator and the grey code to digital word converter circuit of FIG. 2 can all be formed on a single integrated circuit (or possibly multiple integrated circuits, if need be).

Figure 6B:
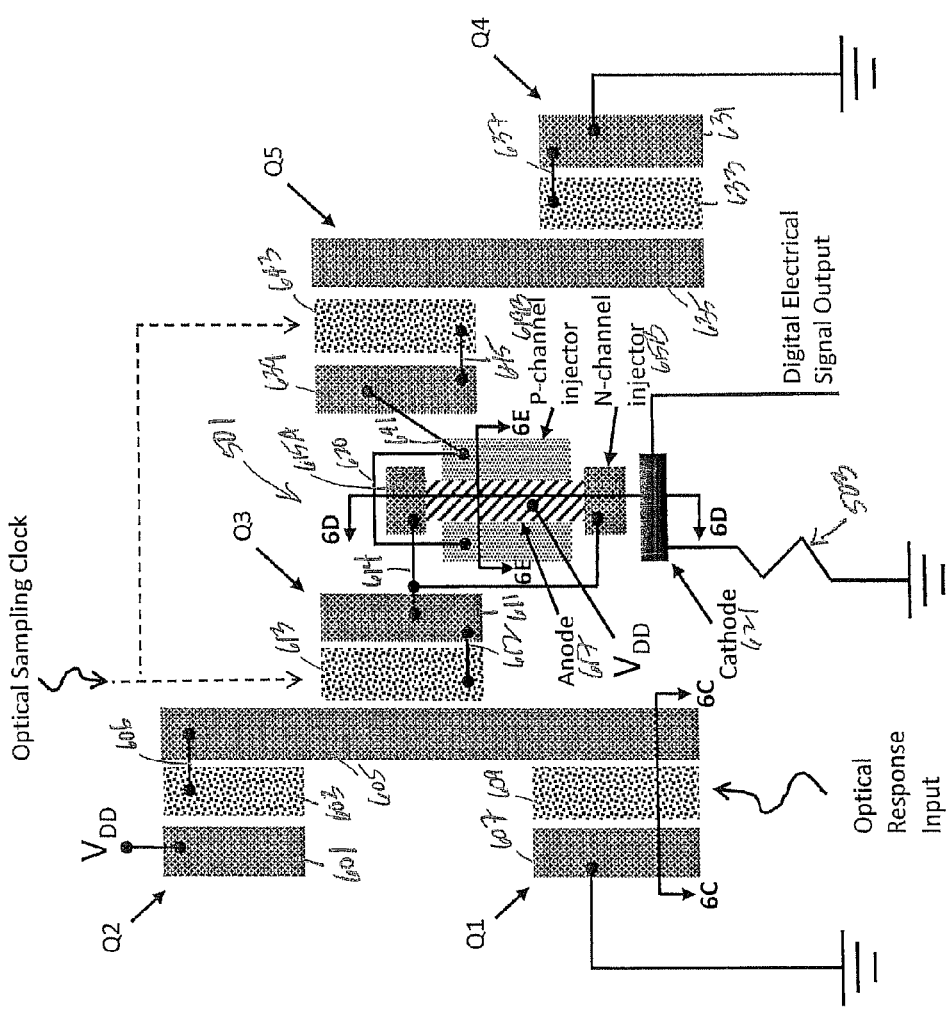
FIG. 6B is a schematic top view illustrating the layout of the circuit elements of FIG. 5 as formed in the layer structure of FIG. 6A.

FIGS. 6B-6E illustrate a configuration of the optoelectronic thyristor comparator circuit of FIG. 5 that can be made utilizing the layer structure of FIG. 6A. FIG. 6B is a schematic top view of the circuit illustrating the layout of the circuit elements as formed in the layer structure of FIG. 6A, which includes an n-channel HFET transistor device Q2 coupled in series to the n-channel HFET phototransistor device Q1 between the positive voltage supply ($V_{DD}$) and the negative voltage supply (ground). The drain terminal electrode 601 of the n-channel HFET transistor device Q2 is connected to the positive voltage supply ($V_{DD}$). The gate terminal electrode 603 of the n-channel HFET transistor device Q2 is offset from an elongate electrode 605 (and also connected to the elongate electrode by a conductor 606). The electrode 605 extends laterally therefrom to form the source terminal electrode of the n-channel HFET transistor device Q2, the drain terminal electrode of the n-channel HFET phototransistor device Q3 and the drain terminal electrode of the n-channel HFET phototransistor device Q1.

The source terminal electrode 607 of the n-channel HFET phototransistor device Q1 is connected to the negative voltage supply (ground). The gate terminal electrode 609 of the n-channel HFET phototransistor device Q1 is offset laterally between the source terminal electrode 607 and the drain terminal electrode 605 of the re-channel HFET phototransistor device Q1.

The source terminal electrode 611 of the n-channel HFET phototransistor device Q3 is connected to the n-channel injector terminal portions 615A, 615B of the thyristor 501 by conductors 614. The gate terminal electrode 613 of the n-channel HFET phototransistor device Q3 is offset laterally between the source terminal electrode 611 and the drain terminal electrode 605 of the n-channel HFET phototransistor device Q3 (and is also connected to the source terminal electrode 611 by a conductor 613).

The thyristor 501 includes two n-channel injector terminal portions 615A, 615B disposed on opposite ends of an elongate anode terminal electrode 617. The thyristor 501 also includes two p-channel injector terminal portions 619A, 619B that extend along opposite sides of the elongate anode terminal electrode 617 and that are connected together by conductor 620. The thyristor 501 also includes a cathode terminal electrode 621 that is offset laterally from the n-channel injector portion 615b as shown.

In this configuration, the elongate electrode 605 forms an intermediate node which is connected to the n-channel injector terminal portions 615A, 615B of the thyristor 501 via the source-drain current path of n-channel HFET phototransistor Q3.

The n-channel HFET transistor Q4 and the n-channel HFET phototransistor Q5 are coupled in series between the negative voltage supply (ground) and the p-channel injector terminal portions 619A, 619B of the thyristor 501. The n-channel HFET transistor Q4 has a source terminal electrode 631 connected to the negative voltage supply (ground). The gate terminal electrode 633 of the n-channel HFET transistor device Q4 is offset from an elongate electrode 635 (and also connected to the source terminal electrode 631 by a conductor 637). The electrode 635 extends laterally therefrom to form the drain terminal electrode of the n-channel HFET transistor device Q4 and the drain terminal electrode of the n-channel HFET phototransistor device Q5.

The source terminal electrode 639 of the n-channel HFET phototransistor device Q5 is connected to the p-channel injector terminal portions 617A, 617B of the thyristor 501 by a conductor 641. The gate terminal electrode 643 of the n-channel HFET phototransistor device Q5 is offset laterally between the source terminal electrode 639 and the drain terminal electrode 635 of the n-channel HFET phototransistor device Q5 (and is also connected to the source terminal electrode 639 by a conductor 645).

The optical response input signal is guided by a waveguide (such as a passive in-plane waveguide) to the active waveguide region under the gate terminal electrode 609 of the n-channel HFET phototransistor Q1.

The optical sampling clock signal is split (for example, by a 180-degree in-plane hybrid optical coupler) and guided by respective waveguides (such as a passive in-plane waveguides) to the active waveguide region under the gate terminal electrode 613 of the n-channel HFET phototransistor Q3 and to the active waveguide region under the gate terminal electrode 643 of the n-channel HFET phototransistor Q5.

Figure 6C:
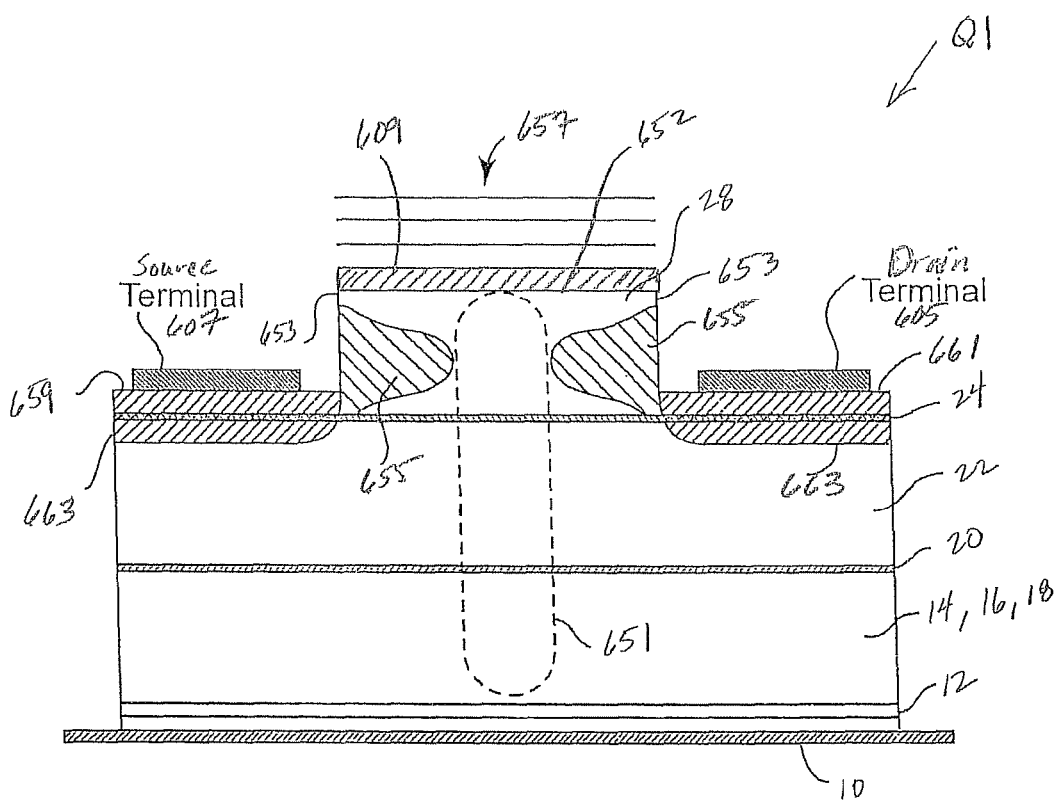
FIG. 6C is a cross-section of the n-channel HFET phototransistor Q1 of FIG. 6B along the line labeled 6C-6C in FIG. 6B.

FIG. 6C is a schematic cross-sectional view of the n-channel HFET phototransistor device Q1 along the section labeled 6C-6C in FIG. 6B. A passive rib waveguide section (not shown) operates to passively guide light (optical mode 651) into the active waveguide region under the gate terminal electrode 609 of the n-channel HFET phototransistor device Q1 that is formed on a mesa 652 defined at the depth of the p-type layers 28 of the active device structure of FIG. 6A. The active waveguide region of the re-channel HFET phototransistor device Q1 is defined by a rib waveguide formed by the mesa 652, which is aligned (both vertically and laterally) with respect to the passive rib waveguide section. The lateral confinement of the optical mode 651 within the active waveguide region of the n-channel HFET phototransistor device Q1 can be provided by the index change associated with vertical sidewalls 653 of the rib waveguide and possibly n-type ion implants 655 in the p-type layers 28 as shown in FIG. 6C. The n-type implants 655 can introduce impurity free vacancy disordering into the adjacent waveguide core region when subjected to rapid thermal annealing. The bandgap of the disordered waveguide core region is increased locally to substantially reduce absorption and associated optical loss. The lateral confinement of the optical mode 651 can also be supported by covering the sidewalls 653 with the top DBR mirror 657.

The source terminal electrode 607 and the drain terminal electrode 605 of the n-channel HFET phototransistor device Q1 are operably coupled to opposite sides of an elongate QW channel(s) realized in the n-type modulation doped QW structure 24 of the active waveguide region of the n-channel HFET phototransistor device Q1. A collector terminal electrode (not shown) can be coupled to the spacer layer(s) 22 of the active waveguide region of n-channel HFET phototransistor device Q1, if desired.

Specifically, the layer structure of the n-channel HFET phototransistor device Q1 is patterned and etched to form the mesa (rib) 652 of the active waveguide region that extends to opposed elongate intermediate mesas 659, 661 in the spacer layer 26 above the n-type modulation doped QW structure 24. N-type donor ions can be implanted through the mesas 659, 661 to form n-type ion implant regions 663 that create the self-aligned n-type contacts to the n-type modulation doped QW structure 24 that forms the QW channel(s) of the active waveguide region of the n-channel HFET phototransistor device Q1. Deposition of a rapid thermal anneal (RTA) oxide and subsequent RTA operations can be carried out to activate the implant regions.

The metal that defines the source and drain terminal electrodes 607, 605 is deposited and patterned on the mesas 659, 661 in contact with the n-type ion implant regions 663 in order to contact the n-type modulation doped QW structure 24 that forms the QW channel(s) of the active waveguide region of the n-channel HFET phototransistor device Q1. The resultant structure can be heated to treat the metals of the source and drain terminal electrodes (and possibly the collector terminal electrodes) as desired.

The n-channel HFET phototransistor device Q1 is a field effect transistor where current flows as a two-dimensional gas through the QW channel region of the n-type modulation doped QW structure 24 of the active waveguide region with the source and drain terminal electrodes 607 and 605 on either side of the QW channel region. The basic transistor action is the modulation of the QW channel conductance by an inversion layer (i.e., a two-dimensional electron gas) that is produced by the absorption of the optical mode 651 propagating within the active waveguide region of the n-channel HFET phototransistor device Q1. Specifically, the QW channel conductance is controlled by the absorption of the optical mode 651 propagating within the active waveguide region of the n-channel HFET phototransistor device Q1, which produces an inversion layer of electron gas in the QW channel of the n-type modulation doped quantum well structure 24 between the source terminal electrode 607 and the drain terminal electrode 605. This inversion layer provides a source-drain current path that allows for the conduction of current between the source terminal electrode 607 and the drain terminal electrode 605. In other words, the source-drain current path of the n-channel HFET phototransistor device Q1 is in its conducting ON state. Without the presence of the inversion, there is no source-drain current path that allows for the conduction of current between the source terminal electrode 607 and the drain terminal electrode 605. In other words, the source-drain current path of the n-channel HFET phototransistor device Q1 is in its non-conducting OFF state. In this configuration, the source terminal electrode 607 is the terminal electrode from which the electron carriers enter the QW channel of the n-type modulation doped QW structure 22, and the drain terminal electrode 609 is the terminal electrode where the electron carriers leave the device.

Note that similar device structures and methods can be used to implement the n-channel HFET phototransistors Q3 and Q5 as well as the n-channel HFET transistors Q2 and Q4 of FIG. 6A.

Figure 6D:
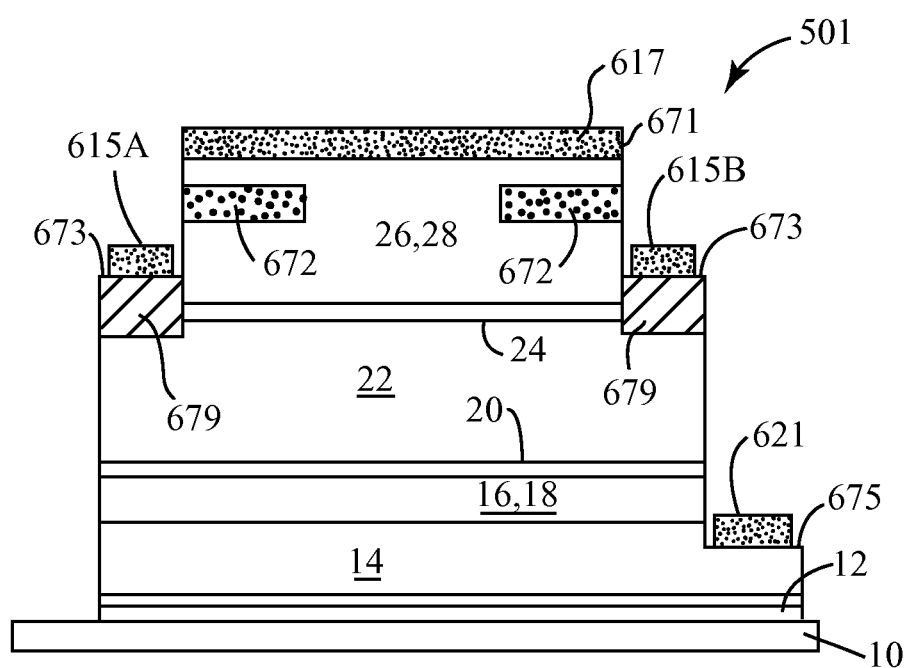
FIG. 6D is a cross-section of the thyristor of FIG. 6B along the line labeled 6D-6D in FIG. 6B.
Figure 6E:
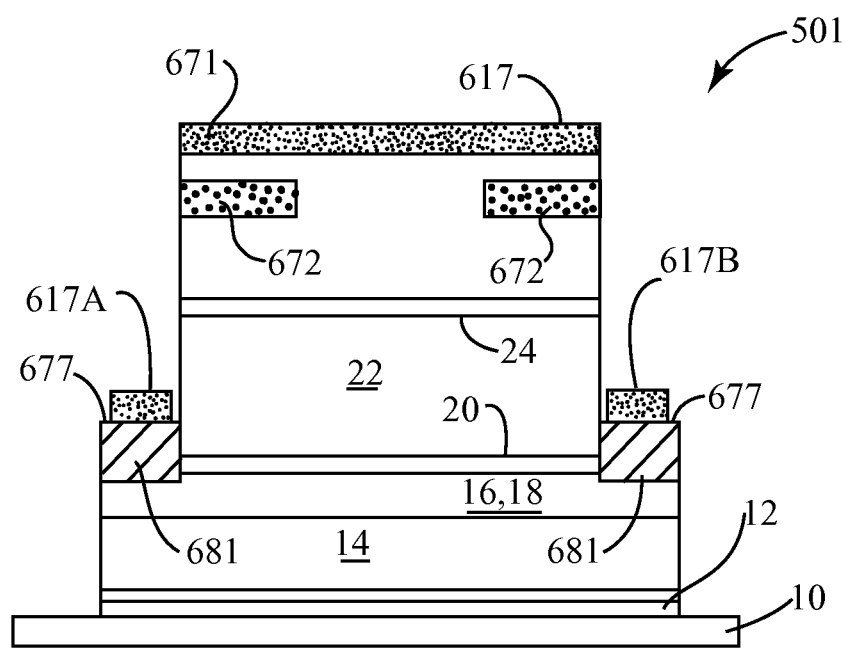
FIG. 6E is another cross-section of the thyristor of FIG. 6B along the line labeled 6E-6E in FIG. 6B.

FIGS. 6D and 6E are schematic cross-sectional views of the thyristor 501 along the sections labeled 6D-6D and 6E-6E, respectively, in FIG. 6B. The thyristor 501 includes a top mesa 671, first intermediate mesas 673 that are disposed on opposite ends of the top mesa 671, and a bottom mesa 675 that is offset laterally beyond one of the first intermediate mesas 673 as evident from FIGS. 6C and 6D. The thyristor 501 also includes second intermediate mesas 677 that extend along opposite sides of the top mesa 671 as evident from FIG. 6C and FIG. 6E.

Referring to FIG. 6D, the top mesa 671 is formed by the top surface of layer 30 of the layer structure of FIG. 6A. Current-funneling ion implant regions 672 can be defined by ion implantation of n-type ions into the p-type layers 28 for the region that will form the top mesa 671. The anode terminal electrode 617 is formed on the top surface of layer 30 for the region that will form the top mesa 671. The anode terminal electrode 617 has an elongate rectangular pattern as best shown in FIG. 6B. The anode terminal electrode 617 contacts the top p-type ohmic contact layer 30. The metal of the anode terminal electrode 617 can be tungsten or other suitable metal or alloy. The metal of the anode terminal electrode 617 can be patterned by lift off or other suitable processing.

The first intermediate mesas 673 of FIG. 6D are formed by patterning and etching the layer structure to a depth in layer(s) 26 above (but near) the n-type modulation doped QW well structure 24 to define vertical sidewalls at the opposed ends of the elongate anode terminal electrode 617. The sidewalls extend to the first intermediate mesa 673 formed in the layer structure in the layer(s) 26 above (but near) the n-type modulation doped QW structure 24. The first intermediate mesas 673 have generally rectangular profiles. The patterned metal of the anode terminal electrode 617 can be used as a mask layer for the etch of the sidewalls leading to the first intermediate mesas 673 if desired.

Referring to FIG. 6E, the second intermediate mesas 677 are formed by patterning and etching the layer structure to a depth in spacer layer 22 above (but near) the p-type modulation doped quantum well structure 20 to define sidewalls that form the generally rectangular profile of the second intermediate mesas 677. These sidewalls extend to the second intermediate mesas 677 formed in the layer structure in spacer layer 22 above (but near) the p-type modulation doped quantum well structure 20. The patterned metal of the anode terminal electrode 617 can be used as a mask layer for the etch of the sidewalls leading to the second intermediate mesas 677 if desired.

Referring back to FIG. 6D, ion implant regions 679 are defined by ion implantation of n-type ions through the first intermediate mesas 673. The ion implant regions 679 are implanted to a depth that encompasses the n-type modulation doped QW structure 24 with a generally rectangular pattern that is disposed laterally outside the projection of the sidewalls that lead to the first intermediate mesas 673 as evident from FIGS. 6C and 6D. The ion implant regions 679 provide for electrical contact to the n-type modulation doped QW structure 24 that extends laterally between the ion implant regions 679.

Referring back to FIG. 6E, ion implant regions 681 are defined by ion implantation of p-type ions through the second intermediate mesas 677. The ion implant regions 681 are implanted to a depth that encompasses the p-type modulation doped QW structure 20 with a generally rectangular pattern that is disposed laterally outside the projection of the sidewalls that lead to the second intermediate mesas 677 as evident from FIGS. 6C and 6E. The ion implant regions 681 provide for electrical contact to the p-type modulation doped QW structure 20 that extends laterally between the ion implant regions 681.

Referring back to FIG. 6D, the resultant structure is patterned and etched to form the bottom mesa 675 at a depth in the n-type ohmic contact layer 14. These operations define sidewalls that form the generally rectangular profile of the bottom mesa 675. These sidewalls extend to the bottom mesa 675 formed in the layer structure in the n-type ohmic contact layer 14.

The n-channel injector terminal electrode portions 615A, 615B are formed on the first intermediate mesas 673 as best shown in FIG. 6D. The n-channel injector terminal electrode portions 615A, 615B contact the n-type ion implant regions 679, which contacts the n-type modulation doped QW structure 24 of the device structure. The p-channel injector terminal electrode portions 617A, 617B are formed on the second intermediate mesas 677 as best shown in FIG. 6E. The p-channel injector terminal electrode portions 617A, 617B contact the p-type ion implant regions 681, which contacts the p-type modulation doped QW structure 20 of the device structure. A cathode terminal electrode 621 is formed on the bottom mesa 675 in contact with the bottom n-type ohmic contact layer(s) 14 as best shown in FIG. 6D. The cathode terminal electrode 426 can be patterned as a rectangular tab as best shown in FIG. 6A or can have some other shape. The metallization of the n-channel injector terminal portions, p-channel injector terminal portions and the cathode electrode terminal can be carried out in tandem with the metallization of the source and drain terminal electrodes (and possibly collector electrodes) of the n-channel HFET devices as described above with respect to FIG. 6B or the electrode(s) of other devices integrally formed on the substrate 10.

Following the metallization, the resultant structure is patterned and etched to form sidewalls that extend to the mirror layers 12. A trench etch can expose the bottom mirror layers 12 in the vicinity of the thyristor 501. The exposed bottom mirror layers 12 can be oxidized in steam ambient. A dielectric top mirror (not shown) can cover the mesas and the sidewalls of the thyristor 501 (and possibly the input waveguide).

The thyristor 501 switches from a non-conducting/OFF state (where the current I through the device is substantially zero) to a conducting/ON state (where current I is substantially greater than zero) when i) the anode terminal electrode 617 is forward biased with respect to the cathode terminal electrode 621 and ii) the voltage between re-channel injector terminal portions 615A, 615B and the anode terminal electrode 617 is biased such that charge is produced in the n-type modulation doped QW structure 24 that is greater than the critical switching charge $Q_{CR}$, which is that charge that reduces the forward breakdown voltage such that no off state bias point exists. The voltage between p-channel injector electrode portions 617A, 617B and the cathode terminal electrode 621 can also be configured to produce a charge in the p-type modulation doped QW structure 20 that is greater than the critical switching charge $Q_{CR}$. The critical switching charge $Q_{CR}$ is unique to the geometries and doping levels of the device. The device switches from the conducting/ON state (where the current I is substantially greater than zero) to a non-conducting/OFF state (where current I is substantially zero) when the current I through device falls below the hold current of the device for a sufficient period of time such that the charge in the n-type modulation doped QW structure 24 (or the charge in the p-type modulation doped QW structure 20) decreases below the holding charge $Q_H$, which is the critical value of the channel charge which will sustain holding action. Thus, if the anode terminal electrode 617 is forward biased with respect to the cathode terminal electrode 621 and the n-channel injector terminal portions 615A, 615B (and/or the p-channel injector terminal portions 617A, 617B) are biased to produce the critical switching charge $Q_{CR}$ in the n-type modulation doped QW structure 24 (or in the p-type modulation doped QW structure 20), then the device will switch to its conducting/ON state. If the current I in the conducting/ON state is above the threshold for lasing $I_{TH}$, then photon emission can occur within the device structure.

The resolution of the photonic analog-to-digital converter system as described herein depends upon the tunable wavelength range of the laser source as well as the limits of the photonic filter to reliably filter a narrow band of wavelengths. It is expected that the laser source can tuned over a range of 150 nm centered around 1000 nm and/or tuned over a range of 230 nm centered around 1550 nm. For the optical filters, passbands down to 100 MHz in size are expected. These constraints provide an extremely large possible resolution in bits. For example, a laser source that is tunable over 60 nm and a filter passband of 1 GHz provides a possible resolution of 60 bits. Thus, it is expected that resolutions more than 60 bits are possible and resolutions less than 60 bits can be implemented if as desired. Furthermore, the photonic analog-to-digital converter system as described herein can provide high speed sampling rates, which are expected to reach up to 100 to 400 gigasamples per second. Together, these attributes allow the photonic digital-to-analog converter system as described herein to be used in the analysis of higher frequency analog signals with high accuracy over small time scales.

There have been described and illustrated herein several embodiments of a photonic analog-to-digital converter system. While particular embodiments of the invention have been described, it is not intended that the invention be limited thereto, as it is intended that the invention be as broad in scope as the art will allow and that the specification be read likewise. It will therefore be appreciated by those skilled in the art that yet other modifications could be made to the provided invention without deviating from its spirit and scope as claimed.

What is claimed is:

1. A photonic analog-to-digital converter comprising:
   a tunable light source that produces an optical signal at a variable wavelength corresponding to analog levels of an electrical input signal;
   an optical sampling clock source that produces an optical sampling clock signal that defines a sequence of sampling periods;
   an optical splitter, operably coupled to the tunable light source, that splits the optical signal produced by the tunable light source for supply to a plurality of optical signal processing channels, wherein each one of the optical signal processing channels includes a photonic filter and corresponding optoelectronic thyristor comparator that is operably coupled to the optical sampling clock source, wherein the optoelectronic thyristor comparator operates as a discriminator that generates a digital electrical signal representing whether the optical signal produced by the tunable light source has a wavelength that lies within a predetermined wavelength quantization level during the sampling periods defined by the optical sampling clock source; and
   circuitry that generates a digital word corresponding to the digital electrical signals generated by the optoelectronic thyristor comparators of the plurality of optical signal processing channels.

2. A photonic analog-to-digital converter according to claim 1, wherein:
   the photonic filter of each respective optical signal processing channel provides passband optical filtering with respect to a wavelength passband corresponding to a given wavelength quantization level used in forming the digital word.

3. A photonic analog-to-digital converter according to claim 1, wherein:
   the optoelectronic thyristor comparator of each respective optical signal processing channel includes a vertical thyristor and supporting optoelectronic circuitry that is configured to provide optical thresholding of an optical filter response signal supplied thereto during sampling periods defined by the optical sampling clock.

4. A photonic analog-to-digital converter according to claim 3, wherein:
   in the event that the intensity of the optical filter response signal exceeds a predetermined threshold during a given sampling period, the thyristor is configured to generate a digital electrical signal having a High level; and
   in the event that the intensity of the optical filter response signal does not exceed the predetermined threshold during a given sampling period, the thyristor is configured to generate a digital electrical signal having a Low level.

5. A photonic analog-to-digital converter according to claim 4, wherein:
   the predetermined threshold is configured to discriminate the quantization levels (in the wavelength domain) used to form the digital word during the given sampling period.

6. A photonic analog-to-digital converter according to claim 4, wherein:
   for the time periods outside a given sample period, the thyristor is configured to operate as a latch circuit that outputs the High or Low levels of the digital electrical signal produced in the most-recent sampling period.

7. A photonic analog-to-digital converter according to claim 3, wherein:
   the thyristor is defined by a layer structure that includes a bottom n-type cathode region, an intermediate p-type region formed above the bottom n-type region, an intermediate n-type region formed above the intermediate p-type region, and a top p-type anode region formed above the intermediate n-type region, wherein the thyristor includes an anode terminal electrically coupled to the top p-type anode region, an n-type injector terminal electrically coupled to the intermediate n-type region, a p-type injector terminal electrically coupled to the intermediate p-type region, and a cathode terminal electrically coupled to the n-type cathode region.

8. A photonic analog-to-digital converter according to claim 7, wherein:
   the supporting optoelectronic circuitry of the optoelectronic thyristor comparator includes a first phototransistor configured to receive the optical filter response signal, wherein said first phototransistor has a source-drain current path that is electrically coupled to the n-type injector terminal of the thyristor, and wherein the source-drain current path of the first phototransistor is activated in the event that the received optical filter response signal exceeds a predetermined threshold intensity.

9. A photonic analog-to-digital converter according to claim 8, wherein:
   the first phototransistor is an n-channel HFET phototransistor whose source-drain current channel is electrically coupled between a negative voltage supply and the n-type injector terminal of the thyristor.

10. A photonic analog-to-digital converter according to claim 8, wherein:
    the supporting optoelectronic circuitry of the optoelectronic thyristor comparator further includes a second phototransistor configured to receive the optical sampling clock signal, wherein said second phototransistor has a source-drain current path that is electrically coupled to the n-type injector terminal of the thyristor, and wherein the source-drain current path of the second phototransistor is activated in the event that the received optical sampling clock signal is ON and exceeds a predetermined threshold intensity.

11. A photonic analog-to-digital converter according to claim 10, wherein:
    the second phototransistor is an n-channel HFET phototransistor whose source-drain current path is electrically coupled to the n-type injector terminal of the thyristor.

12. A photonic analog-to-digital converter according to claim 10, wherein:
    the source-drain current paths of the first and second phototransistors are connected in series to provide for electron injection into the n-type injector terminal of the thyristor in the event that the received optical filter response signal exceeds a predetermined threshold intensity and the optical sampling clock signal is ON, wherein such electron injection is configured to switch the thyristor into its ON state where current is conducted from the anode terminal to the cathode terminal of the thyristor.

13. A photonic analog-to-digital converter according to claim 10, wherein:
the supporting optoelectronic circuitry of the optoelectronic thyristor comparator further includes a third phototransistor configured to receive the optical sampling clock signal, wherein said third phototransistor has a source-drain current path that is electrically coupled to the p-type injector terminal of the thyristor, and wherein the source-drain current path of the third phototransistor is activated in the event that the received optical sampling clock signal is ON and exceeds a predetermined threshold intensity.

14. A photonic analog-to-digital converter according to claim 13, wherein:
the third phototransistor is an n-channel HFET phototransistor whose source-drain current path is electrically coupled between a negative voltage supply and the p-type injector terminal of the thyristor.

15. A photonic analog-to-digital converter according to claim 13, wherein:
the source-drain current path of the third phototransistor provides for drainage of holes from the p-type injector terminal of the thyristor in the event that the optical sampling clock signal is ON.

16. A photonic analog-to-digital converter according to claim 7, wherein:
the intermediate n-type and p-type regions of the layer structure of the thyristor include an n-type modulation doped QW structure and a p-type modulation doped QW structure, respectively.

17. A photonic analog-to-digital converter according to claim 16, wherein:
the supporting optoelectronic circuitry of the optoelectronic thyristor comparator includes at least one phototransistor that includes an n-type QW channel formed by the n-type modulation doped QW structure of the epitaxial layer structure.

18. A photonic analog-to-digital converter according to claim 7, wherein:
the layer structure comprises group III-V materials.

19. A photonic analog-to-digital converter according to claim 1, wherein:
the optoelectronic thyristor comparator of each optical signal processing channel carries out sampling downstream from photonic filter functions provided the photonic filter of the optical signal processing channel.

20. A photonic analog-to-digital converter according to claim 1, wherein:
the optical sampling clock signal defines a sampling rate that is at least two times the bandwidth of the electrical signal input.

21. A photonic analog-to-digital converter according to claim 1, wherein:
the photonic filter of each respective optical signal processing channel comprises a Mach-Zehnder interferometer.

22. A photonic analog-to-digital converter according to claim 1, wherein:
the photonic filter of each respective optical signal processing channel comprises a multiple-ring resonator filter.

* * * * *